United States Patent
Song

[11] Patent Number: 6,094,705
[45] Date of Patent: Jul. 25, 2000

[54] METHOD AND SYSTEM FOR SELECTIVE DRAM REFRESH TO REDUCE POWER CONSUMPTION

[75] Inventor: Seungyoon Peter Song, Palo Alto, Calif.

[73] Assignee: picoTurbo, Inc., Santa Clara, Calif.

[21] Appl. No.: 09/266,072

[22] Filed: Mar. 10, 1999

[51] Int. Cl.[7] .................................................. G11C 11/403
[52] U.S. Cl. ........................................... 711/106; 365/222
[58] Field of Search .............................. 711/106; 365/222

[56] References Cited

U.S. PATENT DOCUMENTS

| | | |
|---|---|---|
| 4,725,945 | 2/1988 | Kronstadt et al. . |
| 5,421,000 | 5/1995 | Fortino et al. . |
| 5,469,559 | 11/1995 | Parks et al. . |
| 5,670,993 | 9/1997 | Greene et al. . |
| 5,835,082 | 11/1998 | Perego . |
| 5,920,725 | 7/1999 | Ma et al. . |

*Primary Examiner*—Jack A. Lane
*Attorney, Agent, or Firm*—Sawyer Law Group LLP

[57] ABSTRACT

A method and system for selective refresh for a memory array is disclosed. The method and system comprises providing a plurality of valid bits, each of the valid bits being associated with a row of the memory device; and detecting when data access is performed within a row of the device. The method and system further comprises setting the associated valid bit, the setting of the associated valid bit providing an indication that the row does not need to be refreshed for the refresh period. By providing the valid bits in the refresh controller and associating them with a row of the memory array then if a cell is written or read at least once a duration equivalent to a refresh period, then the cells do not need to be refreshed. When a DRAM cell is accessed (read or written), its charge is fully restored so that it does not need refresh for a duration equivalent to a refresh interval. In applications that use DRAMs to repeatedly write and read data, such as frame buffers in display systems, the DRAM cells may be accessed frequently enough so that the cells may not need to be refreshed at all. If the cells are written or read at least once in a duration equivalent to a refresh period, then they do not need to be refreshed. Accordingly, through the use of the present invention power consumption is significantly reduced.

21 Claims, 1 Drawing Sheet

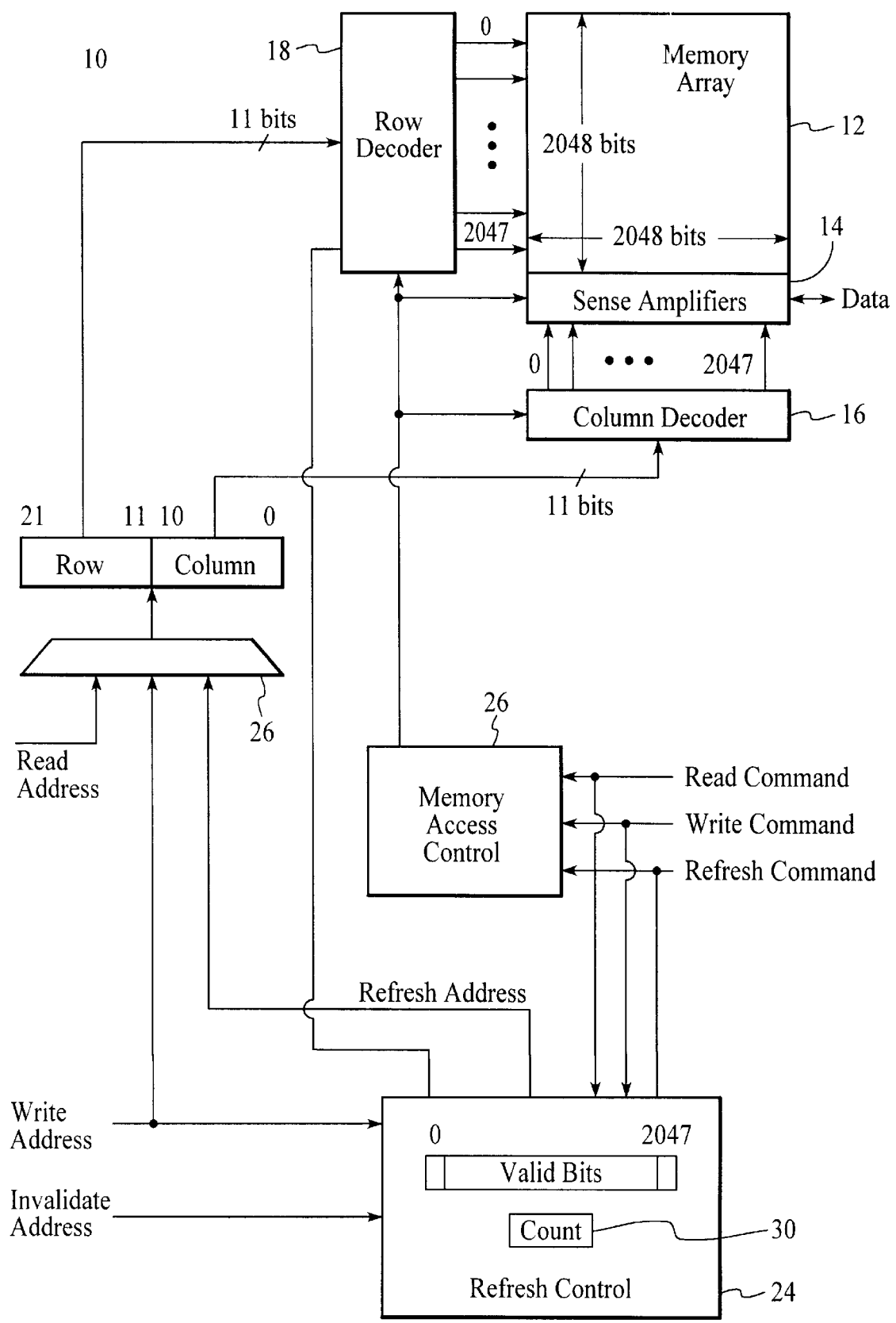

METHOD AND SYSTEM FOR SELECTIVE DRAM REFRESH TO REDUCE POWER CONSUMPTION

FIELD OF THE INVENTION

The present invention relates to dynamic random access memories (DRAMs) and more particularly to a method and system for refreshing DRAMs to minimize power consumption.

BACKGROUND OF THE INVENTION

Dynamic random access memory (DRAM) cells require periodic refresh since they leak charge stored in their capacitors over time, consuming power with each refresh operation. Existing DRAM designs refresh every memory cell in a refresh interval, irrespective of the cell needing refresh, resulting in unnecessary power consumption. In battery-powered applications that use DRAMs, minimizing unnecessary power consumption is critically important. For portable computer systems, such as in notebook computers, eliminating unnecessary power consumption is critically important in prolonging the battery life. Accordingly, what is needed is a system and method for eliminating unnecessary power consumption. The present invention addresses such a need.

SUMMARY OF THE INVENTION

A method and system for selective refresh for a memory array is disclosed. The method and system comprises providing a plurality of valid bits, each of the valid bits being associated with a row of the memory device; and detecting when data access is performed within a row of the device. The method and system further comprises setting the associated valid bit, the setting of the associated valid bit providing an indication that the row does not need to be refreshed for the refresh period.

By providing the valid bits in the refresh controller and associating them with a row of the memory array then if a cell is written or read at least once a duration equivalent to a refresh period, then the cells do not need to be refreshed. When a DRAM cell is accessed (read or written), its charge is fully restored so that it does not need refresh for a duration equivalent to a refresh interval. In applications that use DRAMs to repeatedly write and read data, such as frame buffers in display systems, the DRAM cells may be accessed frequently enough so that the cells may not need to be refreshed at all. If the cells are written or read at least once in a duration equivalent to a refresh period, then they do not need to be refreshed. Accordingly, through the use of the present invention power consumption is significantly reduced.

BRIEF DESCRIPTION OF THE DRAWINGS

FIG. 1 is a block diagram of a system in accordance with the present invention.

DETAILED DESCRIPTION

The present invention relates to an improvement in refreshing DRAMs. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

FIG. 1 is a block diagram of a system 10 in accordance with the present invention. The system 10 comprises a memory array 12. The memory array 12 includes a sense amplifier 14. The sense amplifier 14 receives signals from a column decoder 16. A row decoder 18 provides signals to the memory array. A memory access control 26 receives read command, write command and refresh command signals and provides control signals to the column decoder 16, sense amplifier 14 and row decoder 18. A refresh control device 24 receives invalidate address, write address, read, address command, write read command and refresh command signals and provides a refresh address signal to the column decoder 16 and row decoder 18 via a multiplexer 26. The multiplexer 26 also receives read address and write address signals. The refresh control device 24 includes a valid bit register which corresponds to each row of the memory array 12. The refresh control also includes counter for clearing the valid bit register.

The present invention uses a plurality of valid bits in the refresh controller 24. An "accessed" valid bit indicates a row of cells are accessed together in a memory-array access such as a read, write, or a refresh operation. The row decoder 18 operates as a mechanism 15 that automatically detects when data is written to any cell within a row and sets the accessed valid bit. Finally a mechanism such as a counter periodically clears the accessed bit after a refresh interval is over. In a preferred embodiment, the counter 30 is located within the refresh control.

To describe the present invention in more detail refer to the following. Assume the accessed bit for a row is clear, meaning the row has not been accessed, on power up. On a write operation to any bit or bits in a row, the corresponding accessed valid bit is set, meaning the row contains a bit or bits of data that need not be refreshed. During the periodic refresh interval, an actual refresh operation (restoring charge to the cells) is skipped for the row whose accessed bit is set, thereby reducing power consumption. The accessed bit is cleared after the periodic refresh interval has ended.

By providing the valid bits in the refresh controller 24 and associating them with a row of the memory array 12 then if a cell is written or read at least once a duration equivalent to a refresh period, then the cells do not need to be refreshed. When a DRAM cell is accessed (read or written), its charge is fully restored so that it does not need refresh for a duration equivalent to a refresh interval. In applications that use DRAMs to repeatedly write and read data, such as frame buffers in display systems, the DRAM cells may be accessed frequently enough so that the cells may not need to be refreshed at all. If the cells are written or read at least once in a duration equivalent to a refresh period, then they do not need to be refreshed. Accordingly, through the use of the present invention power consumption is significantly reduced.

In a byte-addressable memory organization, each row should be arranged to contain all bits in consecutive addresses. That is, assuming a row contains 512 DRAM cells, the row should be arranged to contain all eight bits of 64 consecutive byte addresses, resulting in the smallest granularity (64 bytes) for selective refresh. In a less desirable example, if the row were arranged to contain only one bit of a byte of 512 consecutive byte addresses, the selective refresh granularity would be 512 bytes, making selective refresh less effective.

Accordingly, through use of the valid bits and associate with a row of the memory array, power consumption is reduced considerably when a bit is accessed during the refresh interval. When a cell is accessed (read or written), its charge is fully restored so that it does not need refresh for a duration equivalent to a refresh interval. If the cells are written or read at least once in a duration equivalent to a refresh period, then they do not need to be refreshed. Accordingly, through the use of the present invention, power consumption is significantly reduced.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for selective refresh for a memory array comprising the steps of:
   (a) providing a plurality of valid bits, each of the valid bits being associated with a row of the memory array;
   (b) detecting when data access is performed within a row of the memory array; and
   (c) setting the associated valid bit, the setting of the associated valid bit providing an indication that the row does not need to be refreshed for a refresh period.

2. The method of claim 1 wherein the memory array comprises a DRAM.

3. The method of claim 2 wherein the DRAM comprises a plurality of DRAM cells.

4. The method of claim 1 wherein the data access comprises a read operation.

5. The method of claim 1 wherein the data access comprises a write operation.

6. The method of claim 1 wherein the data access comprises a refresh operation.

7. The method of claim 6 which includes the step of clearing the valid bits after a refresh interval.

8. A system for selective refresh of a memory array comprising:
   a row decoder for detecting when data access occurs to a cell within a row and setting one of a plural of valid bits based upon the data access; and
   a refresh control means for providing a refresh address to a row decoder of the memory array; the refresh control means including a register, the register including the plurality of valid bits, each of the plurality of valid bits being associated with one of the rows of the memory arrays.

9. The system of claim 8 wherein the memory array comprises a DRAM.

10. The system of claim 9 wherein the DRAM comprises a plurality of DRAM cells.

11. The system of claim 8 wherein the data access comprises a read operation.

12. The system of claim 8 wherein the data access comprises a write operation.

13. The system of claim 8 wherein the data access comprises a refresh operation.

14. The system of claim 8 which further comprises a counter for clearing the valid bits after a refresh interval.

15. A system for selective refresh for a memory array comprising:
   means for providing a plurality of valid bits, each of the valid bits being associated with a row of the memory array;
   means for detecting when data access is performed within a row of the memory array; and
   means for setting the associated valid bit, the setting of the associated valid bit providing an indication that the row does not need to be refreshed for a refresh period.

16. The system of claim 15 wherein the memory array comprises a DRAM.

17. The system of claim 16 wherein the DRAM comprises a plurality of DRAM cells.

18. The system of claim 15 wherein the data access comprises a read operation.

19. The system of claim 15 wherein the data access comprises a write operation.

20. The system of claim 15 wherein the data access comprises a refresh operation.

21. The system of claim 15 which includes means for clearing the valid bit after a refresh interval.

* * * * *